United States Patent
Yang et al.

(10) Patent No.: US 7,078,749 B1
(45) Date of Patent: Jul. 18, 2006

(54) MEMORY STRUCTURE HAVING TUNABLE INTERLAYER DIELECTRIC AND METHOD FOR FABRICATING SAME

(75) Inventors: Jean Yee-Mei Yang, Sunnyvale, CA (US); Yider Wu, Campbell, CA (US)

(73) Assignee: Spansion LLC, Sunnyvale, CA (US)

( * ) Notice: Subject to any disclaimer, the term of this patent is extended or adjusted under 35 U.S.C. 154(b) by 57 days.

(21) Appl. No.: 10/618,156

(22) Filed: Jul. 11, 2003

(51) Int. Cl.
*H01L 29/788* (2006.01)
(52) U.S. Cl. .................................... 257/288; 257/323
(58) Field of Classification Search ............... 257/758, 257/655, 292, 291, 288, 323, 296, 368, 290; 349/86, 87
See application file for complete search history.

(56) References Cited

U.S. PATENT DOCUMENTS

| | | | | |
|---|---|---|---|---|
| 5,999,152 A | * | 12/1999 | Liao et al. ............... | 345/87 |
| 6,061,107 A | * | 5/2000 | Yang et al. ............... | 349/86 |
| 6,277,436 B1 | * | 8/2001 | Stauf et al. ............... | 427/126.3 |
| 6,545,739 B1 | * | 4/2003 | Matsumoto et al. ......... | 349/198 |
| 6,815,016 B1 | * | 11/2004 | Kyu et al. ................. | 428/1.1 |

* cited by examiner

*Primary Examiner*—Howard Weiss
*Assistant Examiner*—(Vikki) Hoa B. Trinh
(74) *Attorney, Agent, or Firm*—Farjami & Farjami LLP

(57) ABSTRACT

According to one embodiment, a memory structure comprises a substrate having a channel region situated between a source region and a drain region. The memory structure further comprises a gate layer formed over the channel region of the substrate, and a tunable interlayer dielectric formed over the gate layer and the substrate. The tunable interlayer dielectric has a transparent state and an opaque state, and comprises a matrix and electrically or magnetically tunable material situated within the matrix. During the transparent state, UV rays can pass through the tunable interlayer dielectric to the gate layer, e.g., to perform a UV erase operation. During the opaque state, UV rays are prevented from passing through the tunable interlayer dielectric to the gate layer, thereby protecting the gate layer against unwanted charge storage and extrinsic damage that may occur during various processes.

19 Claims, 5 Drawing Sheets

MEMORY STRUCTURE HAVING TUNABLE INTERLAYER DIELECTRIC AND METHOD FOR FABRICATING SAME

1. TECHNICAL FIELD

The present invention relates generally to the field of semiconductor devices. More particularly, the present invention relates to semiconductor memory devices.

2. BACKGROUND ART

Memory devices, such as floating gate flash memory and EPROM, are known in the art for storing data in a wide variety of electronic devices and applications. UV (Ultraviolet) erasable memory devices are fabricated with UV transparent interlayer dielectric (ILD) materials. By providing a UV transparent ILD, process induced charges, such as those stored in a gate dielectric of a memory cell, for example, can be erased during fabrication and prior to programming to avoid unwanted threshold voltage shift in the memory cells of a memory device.

Several drawbacks, however, are associated with conventional UV transparent ILD materials in memory devices. A significant drawback is that UV transparent ILD exposes its adjacent regions, e.g., gate dielectric, to potential unwanted charge created by other processes involving UV radiation during fabrication. Another drawback is that those same regions are also exposed to potential extrinsic damage, such as breaking of bonds in a gate dielectric, during other processes. Yet another drawback with UV transparent ILD is that such materials may have poor gap-filling performance, and thus use of UV transparent ILD creates structural shortcomings in the memory device. As the aspect ratios of gaps, i.e., the ratio of the height to the width of a gap, have increased in conjunction with devices becoming smaller, use of UV transparent ILD becomes even more problematic. Such drawbacks result in unreliable and/or poorly performing memory devices.

Accordingly, there exists a strong need in the art for a memory structure having a tunable interlayer dielectric and a method for fabricating the same.

SUMMARY

The present invention is directed to memory structure having tunable interlayer dielectric and method for fabricating the same. The present invention addresses and resolves the need in the art for a memory structure having a tunable interlayer dielectric suitable for use with UV erase operations and capable of preventing unwanted charge storage and unwanted extrinsic damage. The present invention addresses and resolves the need in the art for a memory structure having a tunable interlayer dielectric capable of filling high aspect ratio gaps during fabrication.

According to one exemplary embodiment, the memory structure comprises a substrate having a channel region situated between a source region and a drain region. The memory structure further comprises a gate layer formed over the channel region of the substrate, and a tunable interlayer dielectric formed over the gate layer and the substrate. The gate layer includes a charge storing layer. According to an exemplary embodiment, the tunable interlayer dielectric has a transparent state and an opaque state, and comprises a matrix, e.g., a polymer matrix, and electrically or magnetically tunable material situated within the matrix. For example, the electrically or magnetically tunable material may comprise liquid crystal droplets, each liquid crystal droplet having a corresponding crystal director defining a polar orientation of each liquid crystal droplet. During the transparent state, the corresponding crystal director has a uniform orientation within the matrix while during the opaque state, the corresponding crystal director has a random orientation within the matrix During the transparent state, UV rays can pass through the tunable interlayer dielectric to the gate layer, e.g., to perform a UV erase operation. During the opaque state, UV rays are prevented from passing through the tunable interlayer dielectric to the gate layer, thereby protecting the gate layer against unwanted charge storage and extrinsic damage that may occur during various processes.

In certain embodiments, the opaque state is enabled by not providing an electrical field through the tunable interlayer dielectric, and the transparent state is enabled by providing an electrical field through the tunable interlayer dielectric. In other embodiments, the opaque state is enabled by providing a magnetic field through the tunable interlayer dielectric, and the transparent state is enabled by not providing a magnetic field through the tunable interlayer dielectric.

In another embodiment, the invention is a method for fabricating the above-discussed structures. Other features and advantages of the present invention will become more readily apparent to those of ordinary skill in the art after reviewing the following detailed description and accompanying drawings.

DETAILED DESCRIPTION OF THE INVENTION

The present invention is directed to memory structure having tunable interlayer dielectric and method for fabricating the same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. For ease of illustration, certain elements of the invention are not drawn to scale.

Figure 1A:
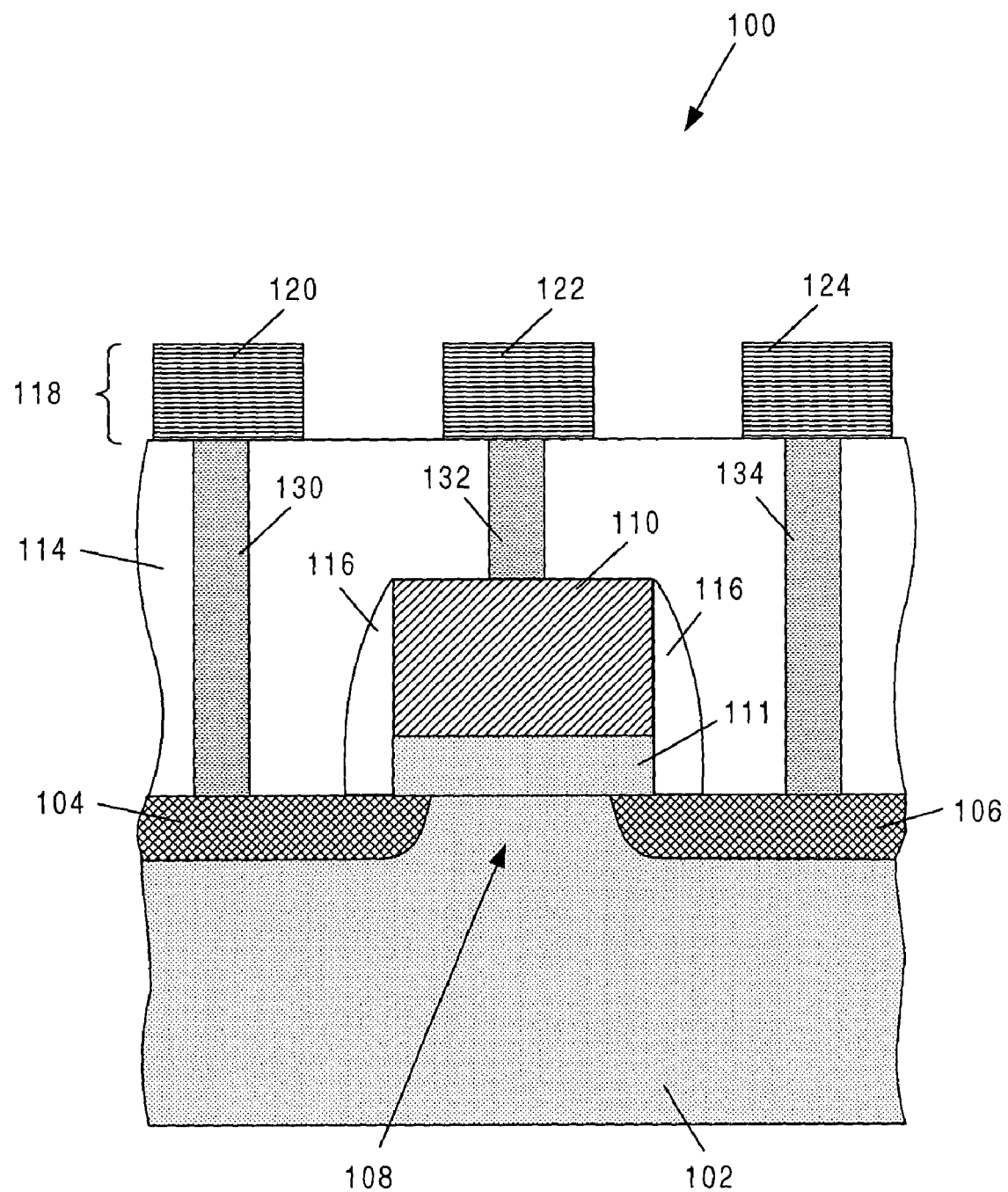
FIG. 1A depicts an exemplary memory structure having a tunable interlayer dielectric in a first state according to one embodiment of the present invention.

FIG. 1A depicts exemplary memory structure 100 according to one embodiment of the present invention. As described more fully below, tunable ILD 114 of memory structure 100 can be configured or tuned to a transparent state and to an opaque state. In this way, the transparent state can be enabled during a UV erase operation to erase processed induced charges, and the opaque state can be enabled during other processes to protect against unwanted charge storage and unwanted extrinsic damage. Also, as discussed below, tunable ILD 114 may comprise superior gap-filling material compared to conventional UV transparent ILD materials, thus improving the structural integrity of memory structure 100.

Figure 1B:
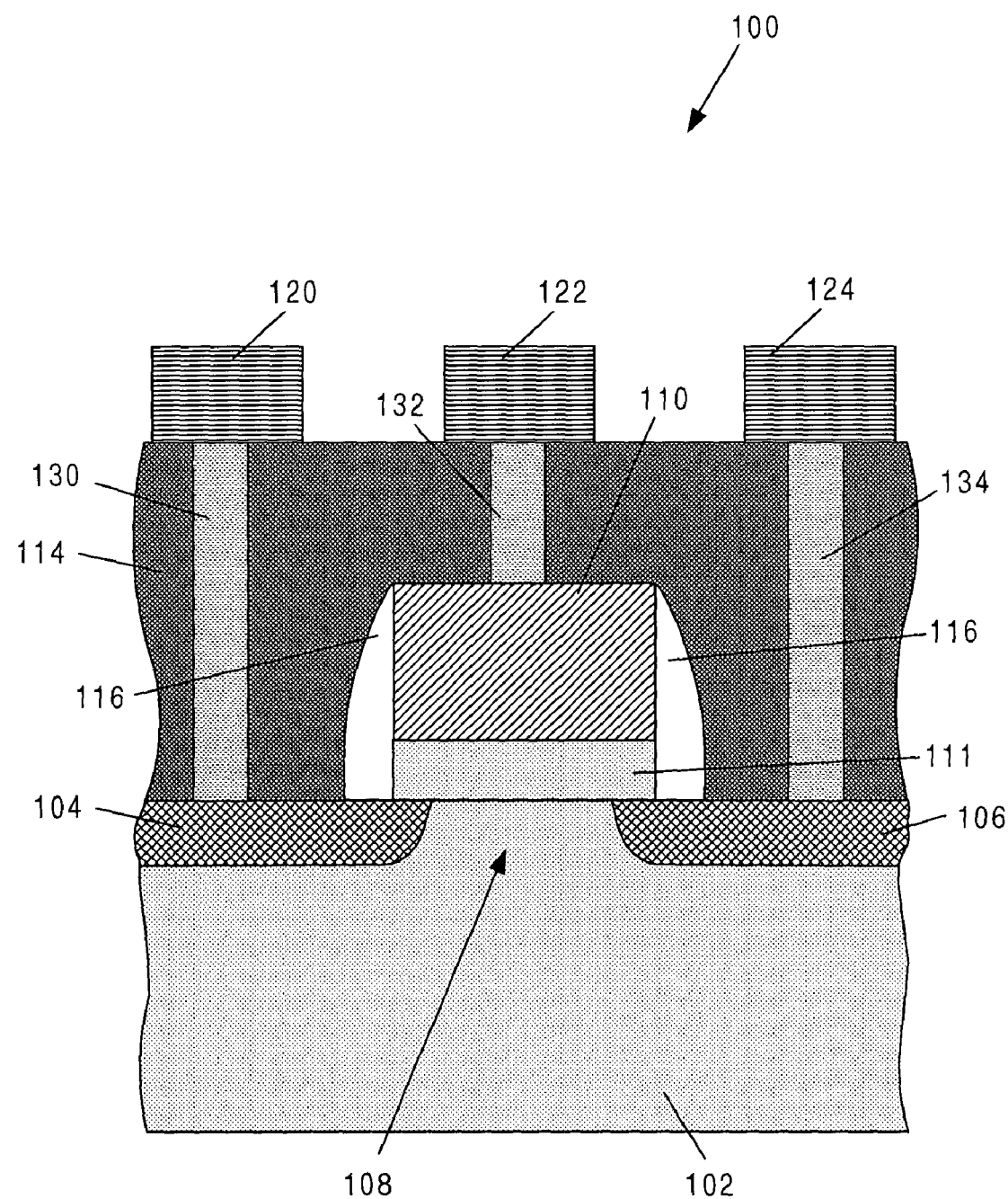
FIG. 1B depicts an exemplary memory structure having a tunable interlayer dielectric in a second state according to one embodiment of the present invention

Memory structure 100 can, for example, be used in a floating gate or EEPROM or SONOS (Silicon Oxide Nitride Oxide Silicon) type memory device, although many other types of memory devices can benefit from the invention. Memory structure 100 comprises silicon substrate 102, wherein terminal region 104 and terminal region 106 are formed opposite each other across channel region 108. By way of illustration, terminal region 104 can be a drain region, and terminal region 106 can be a source region. As shown in FIG. 1A, memory structure 100 includes gate layer 110 situated over channel region 108 of substrate 102 to form a transistor. Gate layer 110 can, for example, comprise a gate stack including a floating gate dielectric layer 111 capable of storing charge. Although shown in simplified form in FIG. 1, it is appreciated that gate layer 110 can comprise various gate stack arrangements including those utilized in floating gate flash memory devices and those employed in Advanced Micro Devices, Inc. (AMD) Mirror-Bit™ memory devices, for example. Spacers 116 are formed on the sidewalls of gate layer 110.

Memory structure 100 further comprises tunable ILD 114 situated over substrate 102 and gate layer 110. As shown in FIG. 1A, metal layer 118 is situated over tunable ILD 114. Metal layer 118 comprises metal segments 120, 122 and 124. Vias 130, 132 and 134 are provided in tunable ILD 114. In exemplary embodiment, via 130 provides an electrical connection between metal segment 120 and terminal region 104; via 132 provides an electrical connection between metal segment 122 and gate layer 110; and via 134 provides an electrical connection between metal segment 124 and terminal region 106. By way of example, vias 130, 132 and 134 can be plated through-holes or filled-in vias.

Continuing with FIG. 1A, tunable ILD 114 comprises a polymer matrix having electrically or magnetically tunable material situated within the polymer matrix. In an exemplary embodiment, tunable ILD 114 comprises liquid crystal droplets situated within a polymer matrix. With this arrangement, tunable ILD 114 can be configured to a transparent state by applying an electric field across tunable ILD 114. Alternatively, tunable ILD 114 can be configured to an opaque state by disconnecting or not applying an electric field across tunable ILD 114.

Figure 2:
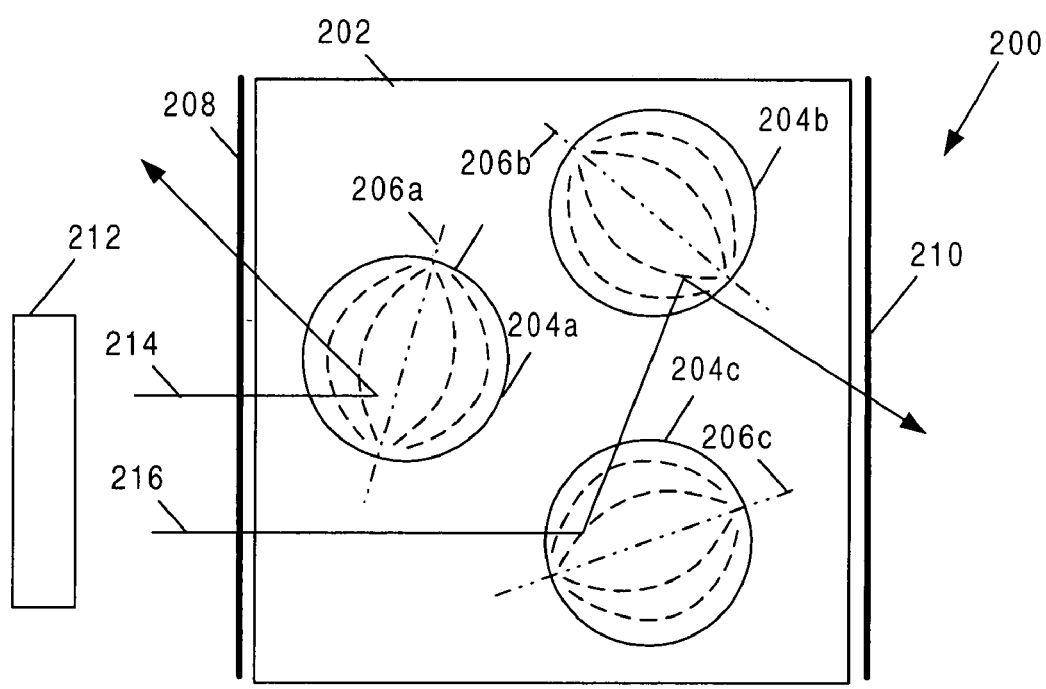
FIG. 2 depicts an exemplary polymer matrix having liquid crystal droplets in an opaque state according to one embodiment of the present invention.

FIG. 2 illustrates exemplary tunable ILD 200 comprising polymer matrix 202 having liquid crystal droplets 204a, 204b and 204c configured in an opaque state according to one embodiment of the present invention. As shown in FIG. 2, each liquid crystal droplet 204a, 204b and 204c has respective crystal director 206a, 206b and 206c. Each crystal director 206a, 206b and 206 defines the relative polar orientation of respective liquid crystal droplet 204a, 204b and 240c. In this particular embodiment, a voltage is not applied across electrodes 208 and 210, and, therefore, an electric field is not present across polymer matrix 202. As a result, crystal directors 206a, 206b and 206c are randomly oriented within polymer matrix 202. In the present application, this particular arrangement wherein crystal directors 206a, 206b and 206c are randomly oriented within polymer matrix 202 is also referred to an "opaque state" because rays 214 and 216 generated by light source 212 does not transparently pass through liquid crystal droplets 204a, 204b and 204c, but is instead blocked or refracted due to the random orientation of crystal directors 206a, 206b and 206c, as shown in FIG. 2. Consequently, tunable ILD 200 has a milky white appearance, rather than a transparent appearance.

Figure 3:
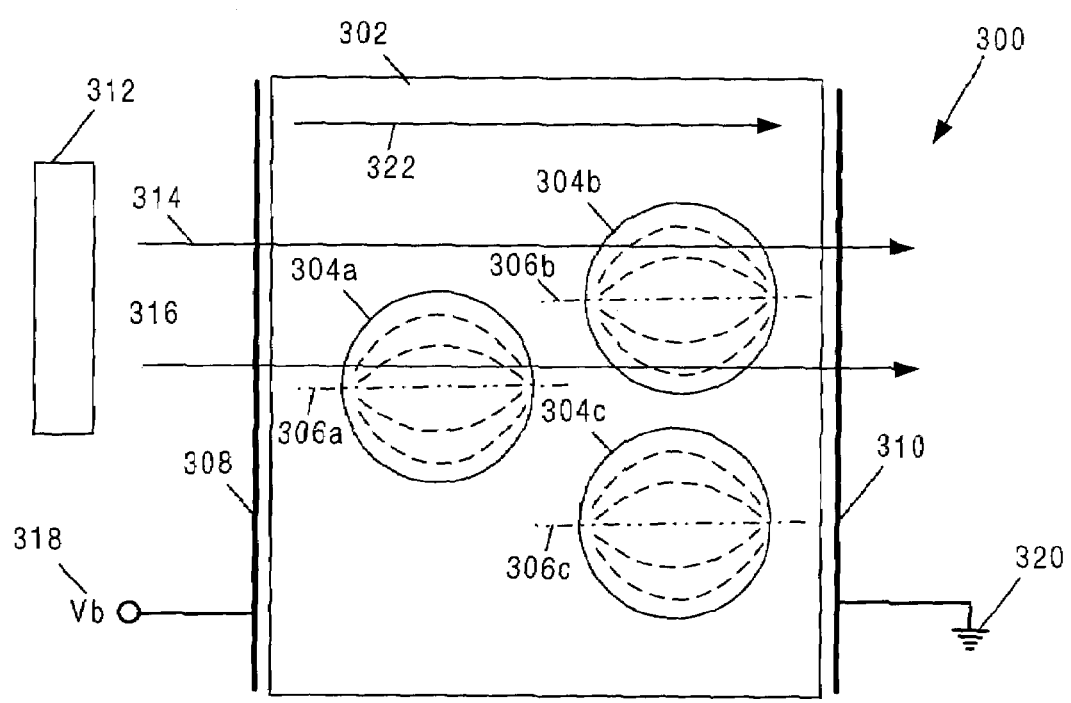
FIG. 3 depicts an exemplary polymer matrix having liquid crystal droplets in a transparent state according to one embodiment of the present invention.

In contrast, FIG. 3 illustrates exemplary tunable ILD 300 comprising polymer matrix 302 having liquid crystal droplets 304a, 304b and 304c configured in a transparent state according to one embodiment of the present invention. Each liquid crystal droplet 304a, 304b and 304c has respective crystal director 306a, 306b and 306c. In this particular embodiment, a voltage (Vb) 318 is connected to electrode 308, and electrode 310 is connected to ground 320 to generate electric field 322 across polymer matrix 302. Responsive to electric field 322, crystal directors 306a, 306b and 306c align in a uniform manner within polymer matrix 302. In the present application, this particular arrangement wherein crystal directors 306a, 306b and 306c are aligned due to electric field 322 is also referred to a "transparent state" because rays 314 and 316 generated by light source 312 transparently pass through liquid crystal droplets 304a, 304b and 304c. In this case, tunable ILD 300 has a transparent appearance.

Referring again to FIG. 1A, tunable ILD 114 is shown in the transparent state. For example, ILD 114 can be configured to the transparent state by generating an electric field through tunable ILD 114, e.g., by applying a voltage to the top pad of memory structure 100 and by connecting the back plane of memory structure 100 to ground. The transparent state may be selected in order to perform a UV erase, e.g., to erase process induced charges stored in gate layer 110.

Referring to FIG. 2B, tunable ILD 114 is shown in the opaque state, depicted by dark shading. As discussed above, the opaque state of tunable ILD 114 is achieved by not applying an electric field through ILD 114. Typically, the opaque state is selected during processes other than during UV rate operation. In this way, UV radiation caused during certain processes is prevented from storing a charge or causing extrinsic damage to gate layer 110 and other adjacent dielectric regions of memory structure 100. This benefit improves the overall performance of a memory device fabricated according to memory structure 100, because the disadvantages discussed above are significantly reduced. Moreover, since memory structure 100 is not limited to UV transparent materials, polymer matrix materials capable of filling gaps with high aspect ratios may be used, thereby improving the structural integrity of memory structure 100. In sum, memory structure 100 results in a memory device having significant performance advantages over conventional solutions.

Figure 4:
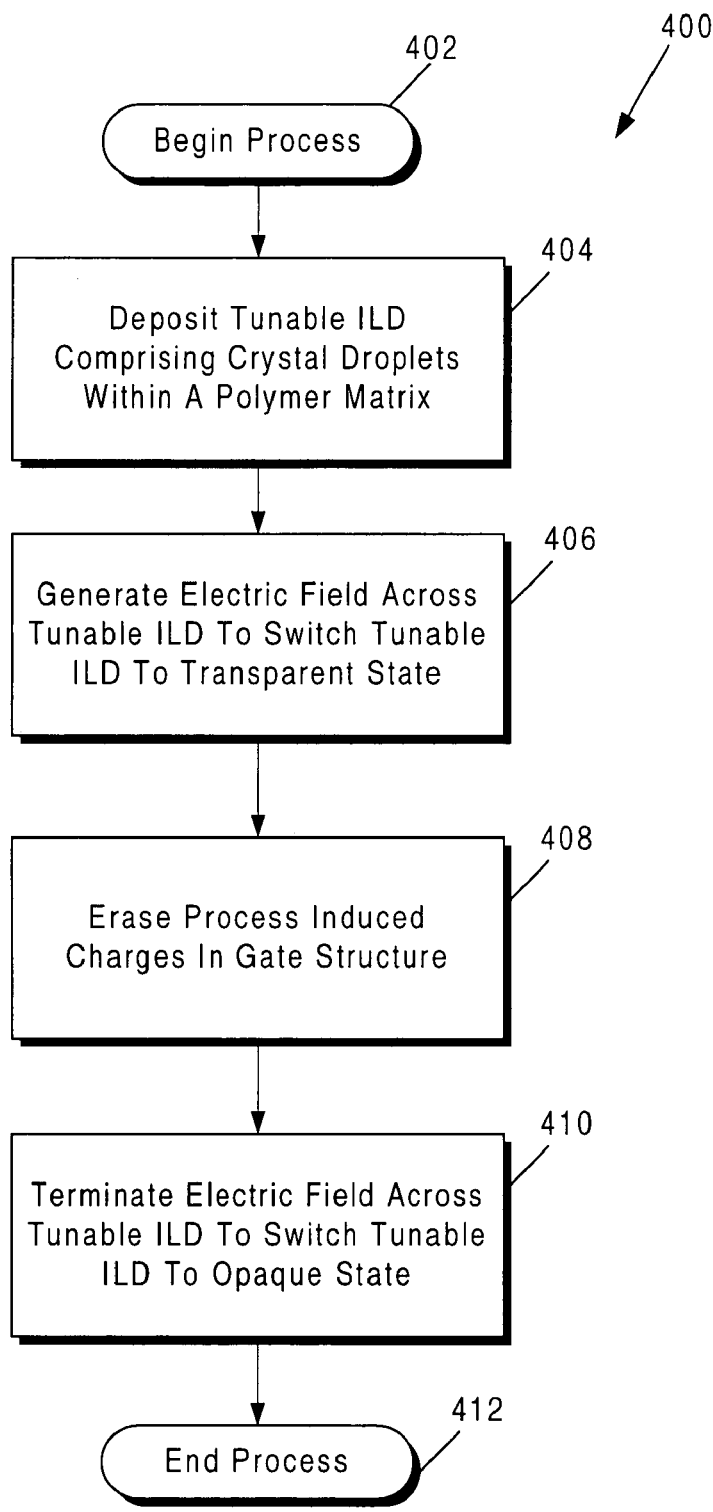
FIG. 4 depicts a flow chart for fabricating a memory structure having a tunable interlayer dielectric according to one embodiment of the invention.

Referring now to FIG. 4, flow chart 400 shows an exemplary method for fabricating a memory structure having a tunable ILD according to one embodiment of the invention. Certain details and features have been left out of flow chart 400 of FIG. 4 that are apparent to a person of ordinary skill in the art. For example, a step may consist of one or more sub-steps or may involve specialized equipment or materials, as known in the art. While steps 402 through 412 shown in flow chart 400 are sufficient to describe one embodiment of the present invention, other embodiments of the invention may utilize steps different from those shown in flow chart 400.

The method begins on a wafer at step 402, wherein prior to step 402 the wafer includes a substrate and might include other structures in the substrate as well. At step 404, a layer of tunable ILD is deposited over the wafer. For example, with reference to FIG. 1A, tunable ILD 114 is deposited over substrate 102 and gate layer 110 during step 402. As discussed above, the tunable ILD comprises a polymer matrix having electrically or magnetically tunable material situated within the polymer matrix. In an exemplary embodiment, the tunable ILD comprises liquid crystal droplets situated within a polymer matrix, wherein the crystal directors of the liquid crystal droplets have a random arrangement within the polymer matrix outside the presence of an electric field, but have a uniform and aligned arrangement within the polymer matrix in the presence of an electric field. Additional processing steps may be carried out after step 404.

At step 406, an electric field is generated across the tunable ILD in order to switch the tunable ILD to the transparent state. As discussed above, an electric field may be generated through the tunable ILD by connecting the top pad of the each die on the wafer to a voltage and connecting the back plane of the wafer to ground. At step 408, an erase operation is carried out to erase any process induced charges stored within adjacent regions of a memory cell. For example, with reference to FIG. 1A, since tunable ILD 114 is in the transparent state during this step, a UV erase operation may be performed through tunable ILD 114 to erase process induced charges stored in gate layer 110.

At step 410, the electric field generated through the tunable ILD during step 406 is terminated in order to switch the tunable ILD to the opaque state. In an exemplary embodiment, the tunable ILD comprises liquid crystal droplets situated within a polymer matrix. According to this particular embodiment, the crystal directors of the liquid crystal droplets have a random arrangement within the polymer matrix outside the presence of an electric field. As a result, the tunable ILD functions an opaque layer and protects adjacent regions from being exposed to UV radiation, thus preventing adjacent regions from storing unwanted charges or from being damaged. Due to this unique process, tunable ILD layer can be tuned to a transparent state to perform UV erase operations and tuned to an opaque state during other processes in order to provide protection against unwanted charge storage and extrinsic damage. As a further benefit, polymer matrix materials used for the tunable ILD can be selected from a group capable of filling high aspect ratio gaps in the wafer, thereby improving the structural integrity of the memory device. The exemplary process is completed at step 412, although additional fabrication processes may also be performed before, during, and/or after the steps shown in flow chart 400.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, other types of tunable material may be used within the polymer matrix of the tunable ILD. Indeed, certain amorphous or crystalline materials may be aligned according to a magnetic field in order to switch the tunable ILD to a transparent state. Furthermore, different matrix materials can also be used including Silicon Carbide (SiC) and other compounds containing combinations of Silicon and Oxygen or Silicon and Nitrogen, for example. Moreover, in certain embodiments, a number of layers of tunable ILD may be used within the wafer to provide the advantages discussed above across multiple layers of memory structure. Different layers of tunable ILD materials may also be used to satisfy gap filling, temperature tolerance, planarization, and other process requirements. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, memory structure having tunable interlayer dielectric and method for fabricating the same have been described.

The invention claimed is:

1. A memory transistor comprising:
   a substrate having a drain region, a source region and a channel region, said channel region being between said source region and said drain region;
   a gate layer formed over said channel region of said substrate;
   a tunable interlayer dielectric formed over said gate layer and said substrate, said tunable interlayer dielectric comprising a matrix and tunable material situated within said matrix, said tunable interlayer dielectric having a transparent state and an opaque state, said transparent state allowing UV rays to pass through said tunable interlayer dielectric to said gate layer, said opaque state preventing UV rays to pass through said tunable interlayer dielectric to said gate layer.

2. The memory transistor of claim 1, wherein said tunable material comprises a plurality of liquid crystal droplets, each of said plurality of liquid crystal droplets having a corresponding crystal director, said corresponding crystal director defining a polar orientation of each of said plurality of liquid crystal droplets.

3. The memory transistor of claim 2, wherein said corresponding crystal director has a random orientation within said matrix during said opaque state.

4. The memory transistor of claim 3, wherein said opaque state is enabled when an electric field is not applied across said tunable interlayer dielectric.

5. The memory transistor of claim 3, wherein said opaque state is enabled when a magnetic field is applied across said tunable interlayer dielectric.

6. The memory transistor of claim 2, wherein said corresponding crystal director has a uniform orientation within said matrix during said transparent state.

7. The memory transistor of claim 6, wherein said transparent state is enabled when an electric field is applied across said tunable interlayer dielectric.

8. The memory transistor of claim 6, wherein said transparent state is enabled when a magnetic field is not applied across said tunable interlayer dielectric.

9. The memory transistor of claim 1, wherein said tunable material is selected from the group consisting of electrically tunable material and magnetically tunable material.

10. The memory transistor of claim 1, wherein said matrix is polymer.

11. The memory transistor of claim 1, wherein said gate layer includes a charge storing layer.

12. A memory transistor comprising a substrate having a drain region, a source region and a channel region, said channel region being between said source region and said drain region, said memory transistor further comprising a gate layer formed over said channel region of said substrate, said gate layer including a charge storing layer, said memory transistor characterized by:

a tunable interlayer dielectric formed over said gate layer and said substrate, said tunable interlayer dielectric comprising a matrix and tunable material situated within said matrix, said tunable interlayer dielectric having a transparent state and an opaque state, said transparent state allowing UV rays to pass through said tunable interlayer dielectric to said gate layer, said opaque state preventing UV rays from passing through said tunable interlayer dielectric to said gate layer.

13. The memory transistor of claim 12, wherein said tunable material comprises a plurality of liquid crystal droplets, each of said plurality of liquid crystal droplets having a corresponding crystal director, said corresponding crystal director defining a polar orientation of each of said plurality of liquid crystal droplets.

14. The memory transistor of claim 13, wherein, during said opaque state, said corresponding crystal director has a random orientation within said matrix.

15. The memory transistor of claim 13, wherein, during said transparent state, said corresponding crystal director has a uniform orientation within said matrix.

16. The memory transistor of claim 15, wherein said transparent state is enabled by providing an electric field through said tunable interlayer dielectric.

17. The memory transistor of claim 12, wherein said tunable material is selected from the group consisting of electrically tunable material and magnetically tunable material.

18. The memory transistor of claim 12, wherein said matrix is polymer.

19. The memory transistor of claim 12, wherein said gate layer includes a charge storing layer.

* * * * *